(12) United States Patent
Shih et al.

(10) Patent No.: US 8,792,540 B2
(45) Date of Patent: Jul. 29, 2014

(54) AMPLIFIERS AND TRANSCEIVER DEVICES USING THE SAME

(75) Inventors: Yi-Shing Shih, Changhua (TW); Yuan-Hung Chung, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 18 days.

(21) Appl. No.: 13/612,777

(22) Filed: Sep. 12, 2012

(65) Prior Publication Data

US 2013/0156079 A1 Jun. 20, 2013

Related U.S. Application Data

(60) Provisional application No. 61/554,159, filed on Nov. 1, 2011.

(51) Int. Cl.
 *H04B 13/02* (2006.01)
(52) U.S. Cl.
 USPC ............................ 375/221; 375/296; 375/297

(58) Field of Classification Search
 USPC ......................................... 375/221, 296, 297
 See application file for complete search history.

(56) References Cited

U.S. PATENT DOCUMENTS

| | | | |
|---|---|---|---|
| 7,719,352 B2 | 5/2010 | Kim et al. | |
| 2007/0004368 A1* | 1/2007 | Lee et al. | 455/323 |
| 2011/0130109 A1 | 6/2011 | Ogasawara | |

* cited by examiner

*Primary Examiner* — Kabir A Timory
(74) *Attorney, Agent, or Firm* — McClure, Qualey & Rodack, LLP (57) ABSTRACT

An amplifier is provided. The amplifier includes a pair of first input transistors, a first load, and a first canceling circuit. The pair of first input transistors is coupled between a pair of first differential nodes and a reference voltage source, for receiving a pair of input signals. The first load is coupled to the pair of first differential nodes and a pair of differential output terminals of the amplifier. The first canceling circuit is coupled between the first differential nodes. The canceling circuit is capable of balancing voltages, respectively, at the first differential nodes when the amplifier is turned off.

19 Claims, 12 Drawing Sheets

AMPLIFIERS AND TRANSCEIVER DEVICES USING THE SAME

CROSS REFERENCE TO RELATED APPLICATIONS

This application claims the benefit of U.S. Provisional Application No. 61/554,159, filed on Nov. 1, 2011, the contents of which are incorporated herein by reference.

BACKGROUND OF THE INVENTION

1. Field of the Invention

The invention relates to an amplifier which is capable of balancing voltages at differential nodes of the amplifier when the amplifier is turned off, and more particularly to a transceiver device using the same.

2. Description of the Related Art

In a transceiver device, a transmitter generates output signals for an antenna unit, and the antenna unit generates a radio frequency (RF) output signal for transmission. The antenna unit receives an RF input signal to generate input signals. An amplifier in a receiver coupled to the antenna unit receives and amplifies the input signals. The other circuits in the receiver, such as mixers, filters, and analog-to-digital converters, then processes the amplified input signal for back-end circuits. Generally, before the transceiver device leaves the factory, the performance of the transmitter and the receiver may be determined through an attenuator between the transmitter and the receiver. In the test mode, the output signals generated by the transmitter are weakened by the attenuator, and the attenuated output signals are received by the receiver. At this time, the amplifier is turned off. Note that the output signals generated by the transmitter may induce leakage current in the amplifier due to unbalanced voltages at differential nodes of the amplifier. The leakage current may disadvantageously affect the attenuator, resulting in an inaccuracy in the performance determination.

Thus, it is desired to provide an amplifier which is capable of balancing voltages at differential nodes of the amplifier when the amplifier is turned off.

BRIEF SUMMARY OF THE INVENTION

An exemplary embodiment of an amplifier is provided. The amplifier comprises a pair of first input transistors, a first load, and a first canceling circuit. The pair of first input transistors are coupled between a pair of first differential nodes and a reference voltage source, for receiving a pair of input signals. The first load is coupled to the pair of first differential nodes and a pair of differential output terminals of the amplifier. The first canceling circuit is coupled between the first differential nodes. The canceling circuit is capable of balancing voltages, respectively, at the first differential nodes when the amplifier is turned off.

An exemplary embodiment of a transceiver device is provided. The transceiver device is capable of operating in a test mode and a normal mode. The transceiver device comprises an antenna unit, a transmitter, an amplifier, a receiver mixing unit, and a loopback path circuit. The antenna unit is capable of receiving a radio frequency input signal to generate a pair of input signals and receive a pair of output signals to generate an RF output signal. The transmitter has a pair of first differential output terminals coupled to the antenna unit, respectively, at a first common node and a second common node. The transmitter is capable of providing the pair of output signals. The amplifier has a pair of first differential input terminals coupled to the antenna unit, respectively, at the first and second common nodes. The amplifier is capable of receiving the pair of input signals and performing an amplifying operation on the pair of input signals. The receiver mixing unit has a pair of second differential input terminals coupled to the amplifier. The receiver mixing unit is capable of receiving the pair of amplified input signals from the amplifier. The loopback path circuit is coupled between the first and second common nodes and the pair of second differential input terminals of the receiver mixing unit. The amplifier comprises a pair of first input transistors, a first load, and a first canceling circuit. The pair of first input transistors are coupled between a pair of first differential nodes and a reference voltage source, for receiving the pair of input signals. The first load is coupled to the pair of first differential nodes and a pair of second differential output terminals of the amplifier. The first canceling circuit is coupled between the first differential nodes. The first canceling circuit is capable of balancing voltages, respectively, at the first differential nodes when the transceiver device operates in the test mode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
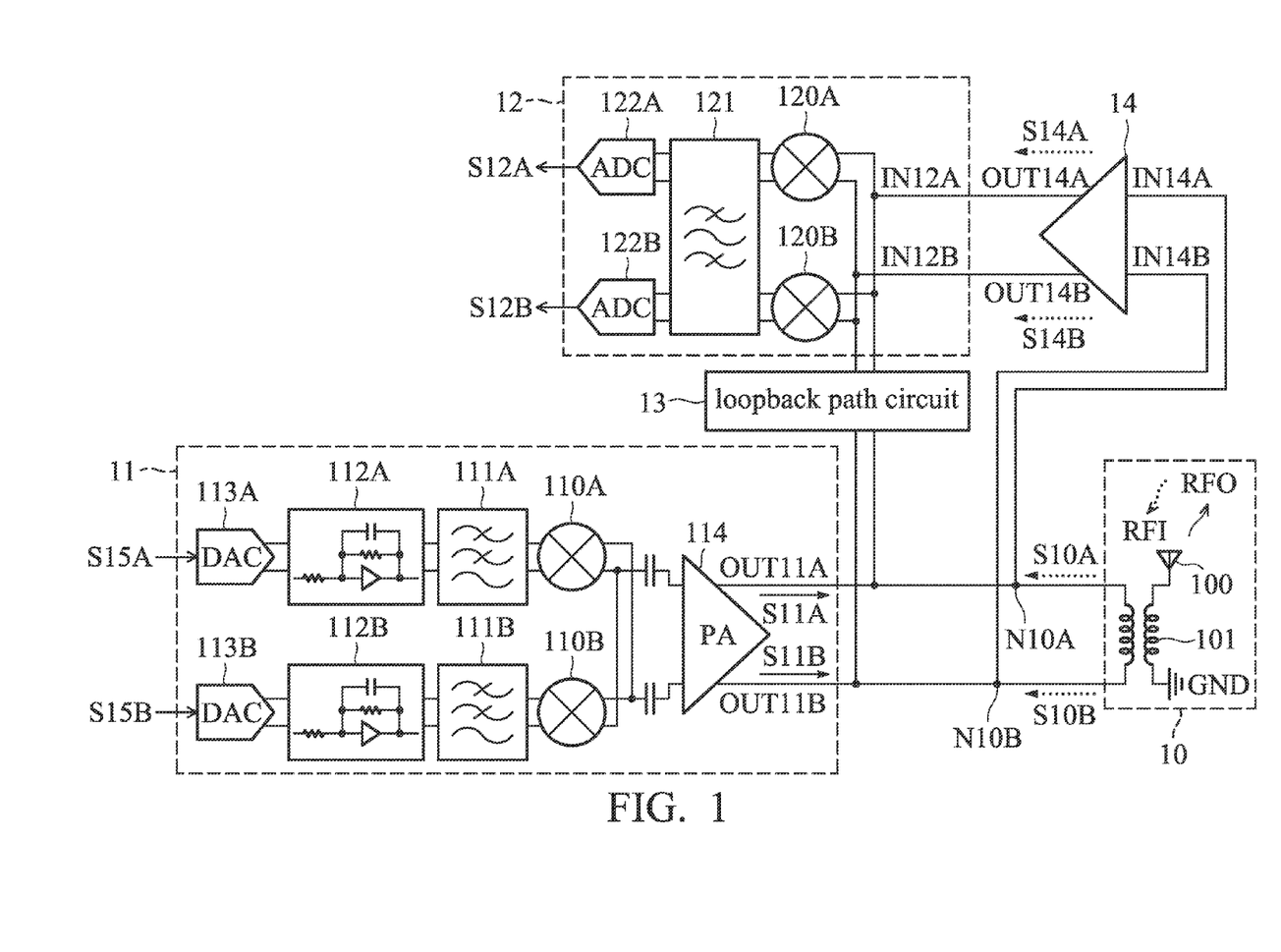
FIG. 1 shows an exemplary embodiment of a transceiver device.

FIG. 1 shows an exemplary embodiment of a transceiver device. As shown in FIG. 1, a transceiver device 1 may comprises an antenna unit 10, a transmitter 11, a receiver mixing unit 12, a loopback path circuit 13, and an amplifier 14. In the embodiment, the amplifier 14 may be implemented by a low noise amplifier (LNA). The antenna unit 10 comprises an antenna 100 and a balun 101. The transmitter 11 has a pair of differential output terminals OUT11A and OUT11B which are coupled to the antenna unit 10 at common nodes N10A and N10B, respectively. The amplifier 14 has a pair of differential input terminals IN14A and IN14B which are coupled to the antenna unit 10 at common nodes N10A and N10B, respectively. The amplifier 14 further has a pair of differential output terminals OUT14A and OUT14B. The receiver mixing unit 12 has a pair of differential input terminals IN12A and IN12B which are coupled to the differential output terminals OUT14A and OUT14B of the amplifier 14, respectively. Referring to FIG. 1, the transmitter 11 comprises mixers 110A and 110B, low pass filters 111A and 111B, buffers 112A and 112B, digital-to-analog converters (DACs) 113A and 113B, and a power amplifier (PA) 114. One skilled in the art knows the operations of the mixers 110A and 110B, the low pass filters 111A and 111B, the buffers 112A and 112B, the DACs 113A and 113B, and the PA 114, thus related descriptions are omitted here. The receiver mixing unit 12 comprises mixers 120A and 120B, a base band filter 121, and analog-to-digital converters (ADCs) 122A and 122B. One skilled in the art knows the operations of the mixers 120A and 120B, the base band filter 121, and the ADCs 122A and 122B, thus related descriptions are omitted here. The loopback path circuit 13 is coupled between the common nodes N10A and N10B and the differential input terminals IN12A and IN12B of the receiver mixing unit 12.

In the embodiment, the transceiver device 1 may operate in one of a normal mode and a test mode. In the normal mode, when a pair of digital signals 515A and 515B from a baseband chip is provided to the transmitter 11, the mixers 110A and 110B, the low pass filters 111A and 111B, the buffers 112A and 112B, the DACs 113A and 113B, and the PA 114 process the digital signals 515A and 515B to generate a pair of output signals 511A and 511B. The balun 101 receives output signals 511A and 511B and then transfers the output signals 511A and 511B to a radio frequency (RF) output signal RFO, and then the antenna 100 sends the RF output signal RFO. In FIG. 1, the digital signals 515A and 515B, the output signals 511A and 511B, and the RF output signal RFO for the transmission operation of the transceiver device 1 are represented by solid lines. In the normal mode, when the antenna 100 receives an RF input signal RFI, the balun 101 transfers the RF input signal RFI to a pair of input signals 510A and 510B. The input signals 510A and 510B are provided to the amplifier 14 via the differential input terminals IN14A and IN14B, respectively. The amplifier 14 performs an amplifying operation on the input signals 510A and 510B to generate amplified input signals 514A and 514B at the differential output terminals OUT14A and OUT14B, respectively. Then, the mixers 120A and 120B, the base band filter 121, and the ADCs 122A and 122B of the receiver mixing unit 12 processes the amplified input signals 514A and S14B to generate digital signals S12A and S12B. In FIG. 1, the RF input signal RFI, the input signals S10A and S10B, and the amplified input signals S14A and S14B for the receiving operation of the transceiver device 1 are represented by dotted lines.

In the test mode, the amplifier 14 is turned off. The transmitter 11 generates the output signals S11A and S11B according to the digital signals S15A and 15B. The output signals S11A and S11B are transmitted to the receiver mixing unit 12 through the loopback path circuit 13.

Figure 2:
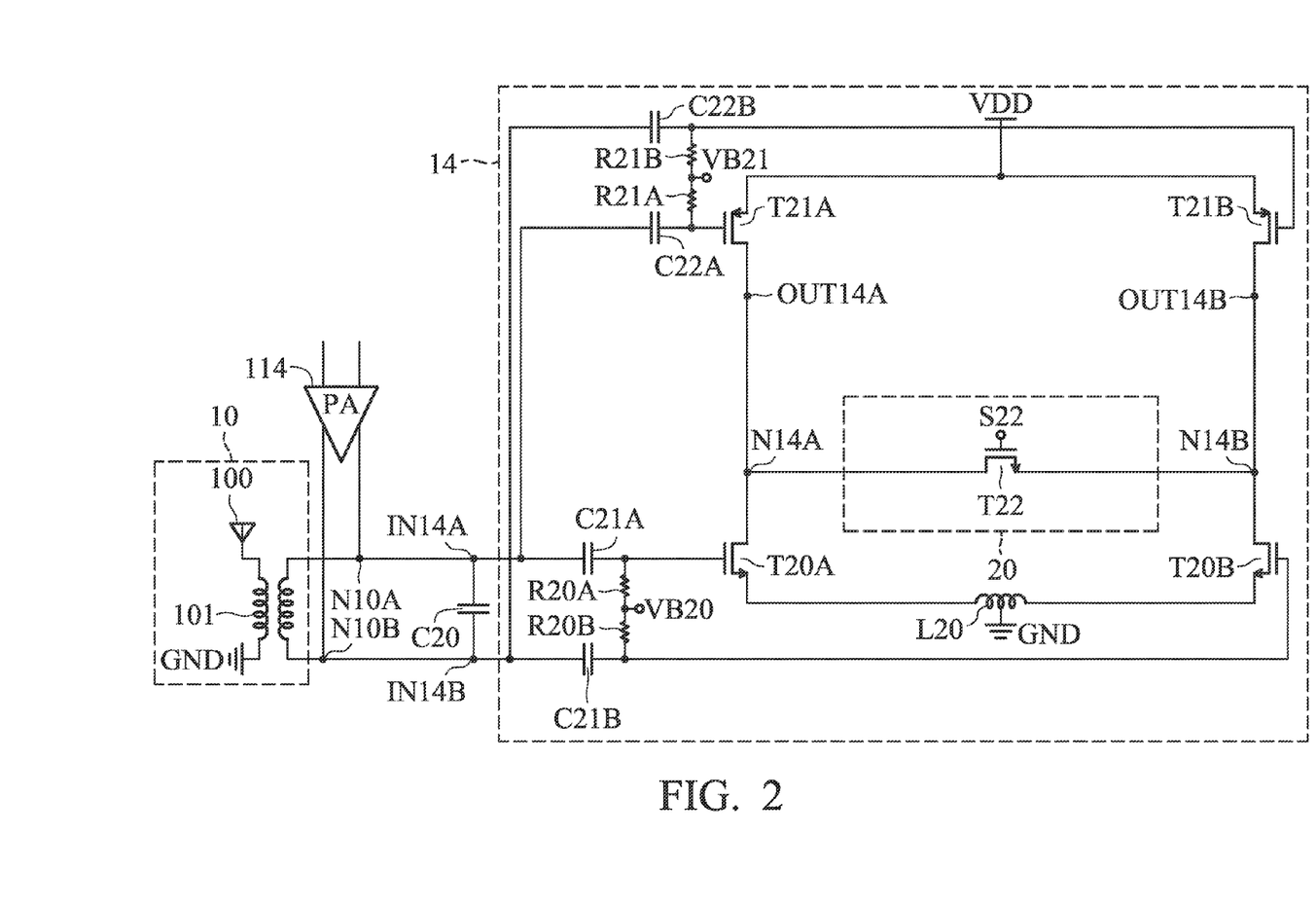
FIG. 2 shows one exemplary embodiment of an amplifier in the transceiver device of FIG. 1.

FIG. 2 shows one exemplary embodiment of the amplifier 14. For clarity, FIG. 2 shows the antenna unit 10, the amplifier 14, and the PA 114 of the transmitter 11. As shown in FIG. 2, the transceiver device 1 further comprises a capacitor C20 is coupled between the common nodes N10A and N10B. The amplifier 14 has a differential structure. The amplifier 14 comprises capacitors C21A, C21B, C22A, and C22B, resistors R20A, R20B, R21A, and R21B, an inductor L20, a pair of input transistors T20A and T20B, a pair of input transistor T21A and T21B, and a canceling circuit 20. In the embodiment, the input transistors T20A and T20B are implemented by N-type transistors, while the input transistors T21A and T21B are implemented by P-type transistors. Gates (e.g., the control electrodes) of the input transistor T20A and T20B are coupled to the differential input terminals IN14A and the IN14B through the capacitors C21A and C21B for receiving the input signals S10A and S10B in the normal mode, respectively. Sources (e.g., the first electrodes) of the input transistor T20A and T20B are coupled to a reference voltage source through the inductor L20. In the embodiment, the reference voltage source coupled to the sources of the input transistor T20A and T20B provides a ground voltage GND. Drains (e.g., the second electrodes) of the input transistor T20A and T20B are coupled to a pair of differential nodes N14A and N14B, respectively. In the embodiment of FIG. 2, the differential node N14A is directly connected to the differential output terminal OUT14A of the amplifier 14, while the differential node N14B is directly connected the differential output terminal OUT14B of the amplifier 14. The resistors R20A and R20B are coupled in series between the gates of the input transistors T20A and T20B.

As shown in FIG. 2, gates (e.g., the control electrodes) of the input transistors T21A and T21B are coupled to the differential input terminals IN14A and the IN14B through the capacitors C22A and C22B for receiving the input signals S10A and S10B in the normal mode, respectively. Sources (e.g., the first electrodes) of the input transistors T21A and T21B are coupled to a reference voltage source. In the embodiment, the reference voltage source coupled to the sources of the input transistors T21A and T21B provides a supplying voltage VDD. Drains (e.g., the second electrodes) of the input transistors T21A and T21B are coupled to the differential nodes N14A and N14B (e.g., coupled to the output terminals OUT14A and OUT14B), respectively. The resistors R21A and R21B are coupled in series between the gates of the input transistors T21A and T21B. In the embodiment, the turned-on/turned-off status of the amplifier 14 is determined by at least one bias voltage. When a bias voltage (of appropriate voltage level), for example VB20, is provided to the joint point between the resistors R20A and R20B, and/or a bias voltage (of appropriate voltage level), similarly VB21, is provided to the joint point between the resistors R21A and R21B, the amplifier 14 is turned on, such that the transceiver device 1 can be operated in the normal mode, such as receiving RF signals through the antenna unit 10. On the contrary, when no bias voltage (or its voltage level is not large enough) is provided to the joint point between the resistors R20A and R20B and/or no bias voltage (or its voltage level is not large enough) is provided to the joint point between the resistors R21A and R21B, the amplifier 14 is turned off, such that the transceiver device 1 can be operated in the test mode.

As shown in FIG. 2, the canceling circuit 20 comprises a transistor T22. In the embodiment, the transistor T22 is implemented by an N-type transistor. A source of the transistor T22 is coupled to the differential node N14B, a drain thereof is coupled to the differential node N14A, and a gate thereof receives a control signal S22. When the transceiver device 1 operates in the test mode, the transistor T22 is turned on by the control signal S22. Accordingly, the differential nodes N14A and N14B are coupled together, such that voltages, respectively, at the differential nodes N14A and N14B may be substantially balanced.

Figure 3A:
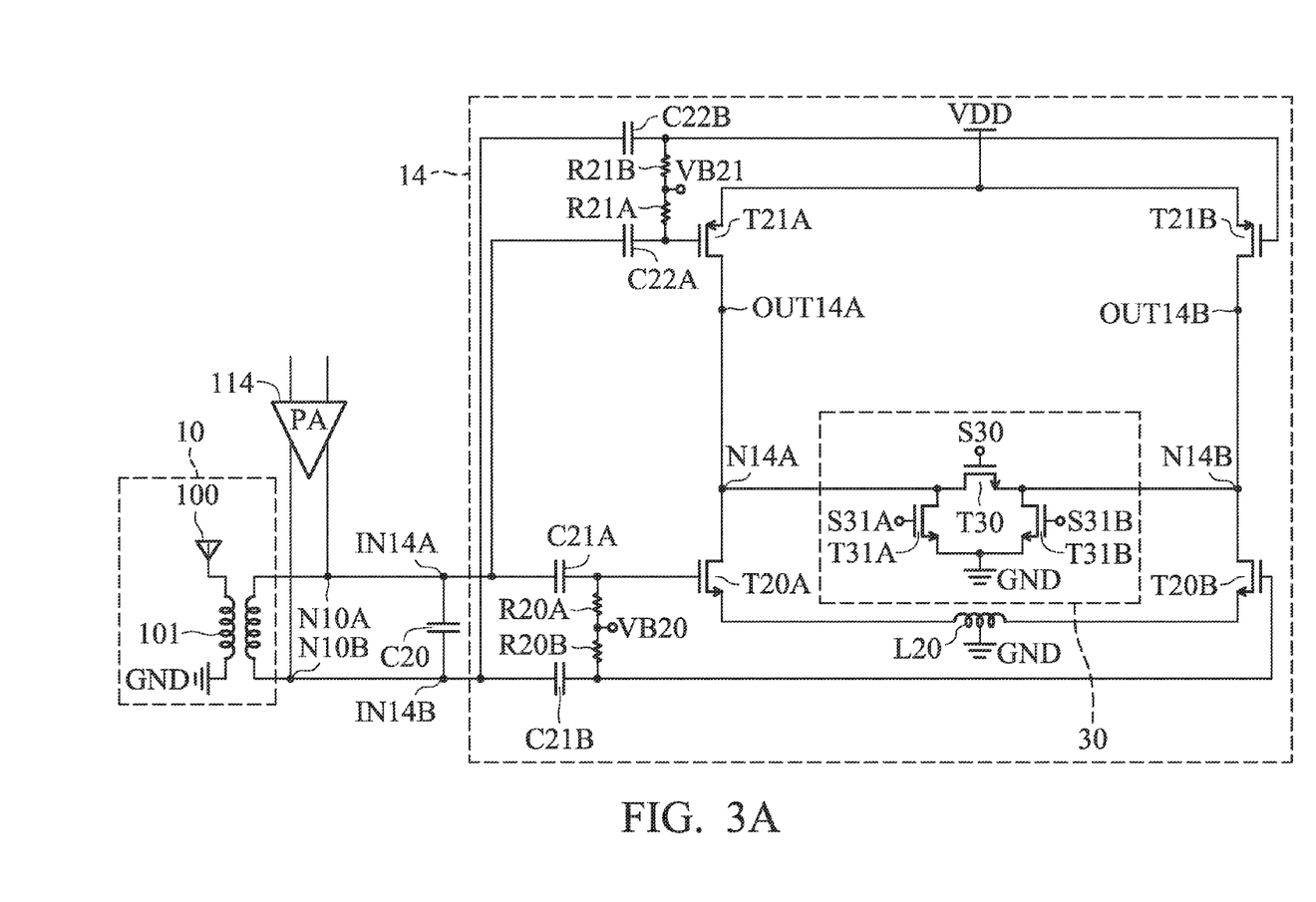
FIG. 3A shows another exemplary embodiment of an amplifier in the transceiver device of FIG. 1.

FIG. 3A shows another exemplary embodiment of the amplifier 14. In FIGS. 2 and 3A, the same elements are labeled with the same reference markings, thus related descriptions are omitted here. In the embodiment of FIG. 3A, a canceling circuit 30 replaces the canceling circuit 20 of FIG. 2. The canceling circuit 30 comprises transistors T30, T31A, and T31B. In the embodiment, the transistors T30, T31A, and T31B are implemented by N-type transistors. A source of the transistor T30 is coupled to the differential node N14B, a drain thereof is coupled to the differential node N14A, and a gate thereof receives a control signal S30. A source of the transistor T31A is coupled to the ground voltage GND, a drain thereof is coupled to the differential node N14A, and a gate thereof receives a control signal S31A. A source of the transistor T31B is coupled to the ground voltage GND, a drain thereof is coupled to the differential node N14B, and a gate thereof receives a control signal S31B. When the transceiver device 1 operates in the test mode, the transistor T30 is turned on by the control signal S31 to balance the voltages, respectively, at the differential nodes N14A and N14B. Moreover, the transistors T31A and T31B are turned on, respectively, by the control signals S31A and S31B to pull the voltages at the differential nodes N14A and N14B to a voltage level with respect to the reference voltage source, for example, approximately to the voltage level of the ground voltage GND.

When the transceiver device 1 operates in the test mode, the output signals S11A and S11B generated by the transmitter 11 may also be transmitted to the amplifier 14. The output signals S11A and S11B may be coupled to the differential nodes N14A and N14B through the capacitors C21A, C21B, C22A and C22B and the parasitic capacitors of the input transistors T20A, T20B, T21A, and T21B, respectively. According to the balance operation of the canceling circuit 20 or 30, the voltages, respectively, at the differential nodes N14A and N14B are substantially balanced, thereby decreasing leakage current from the differential input terminals IN14A and IN14B to the differential output terminals OUT14A and OUT14B of the amplifier 14. Thus, in the test mode, the performance of the transmitter 11 and the receiver mixing unit 12 may be determined accurately.

Figure 3B:
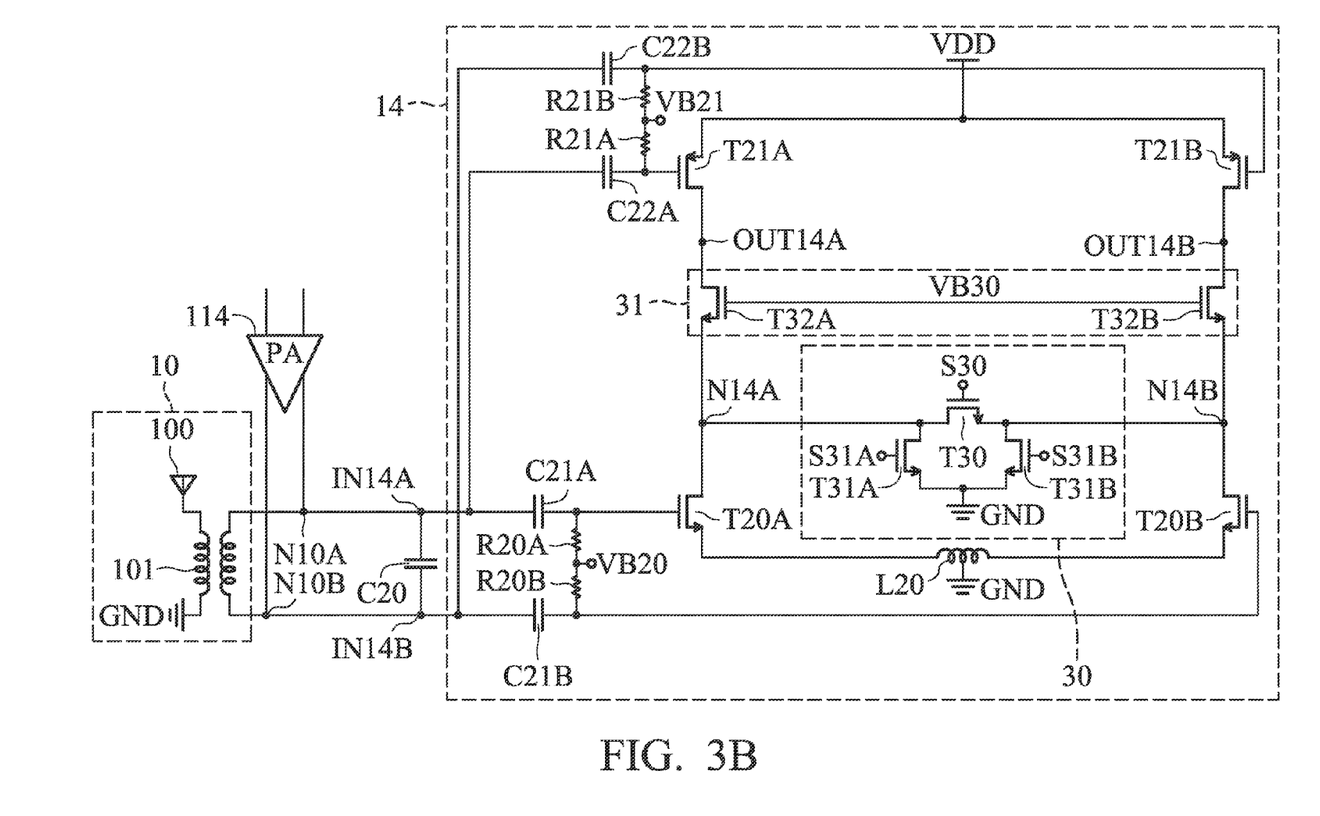
FIG. 3B shows further another exemplary embodiment of an amplifier in the transceiver device of FIG. 1.

FIG. 3B shows another exemplary embodiment of the amplifier 14. In FIGS. 3A and 3B, the same elements are labeled with the same reference markings, thus related descriptions are omitted here. In the embodiment of FIG. 3B, the amplifier 14 further comprises a load 31. The load 31 is coupled to the differential nodes N14A and N14B and the differential output terminals OUT14A and OUT14B. In FIG. 3B, the load 31 comprises a pair of load transistors T32A and T32B. In the embodiment, the load transistors T32A and T32B are implemented by N-type transistors. Sources of the load transistors T32A and T32B are coupled to the differential nodes N14A and N14B, respectively. Drains of the load transistors T32A and T32B are coupled to the differential output terminals OUT14A and OUT14B. Gates of the load transistors T32A and T32B are coupled together, and a bias VB30 may be provided to the gates of the load transistors T32A and T32B. Similar to the embodiment of FIG. 2, the turned-on/turned-off status of the amplifier 14 is determined by at least one of the bias voltages VB20, VB21 and VB30, and thus the related description of their operation is omitted.

Figure 4:
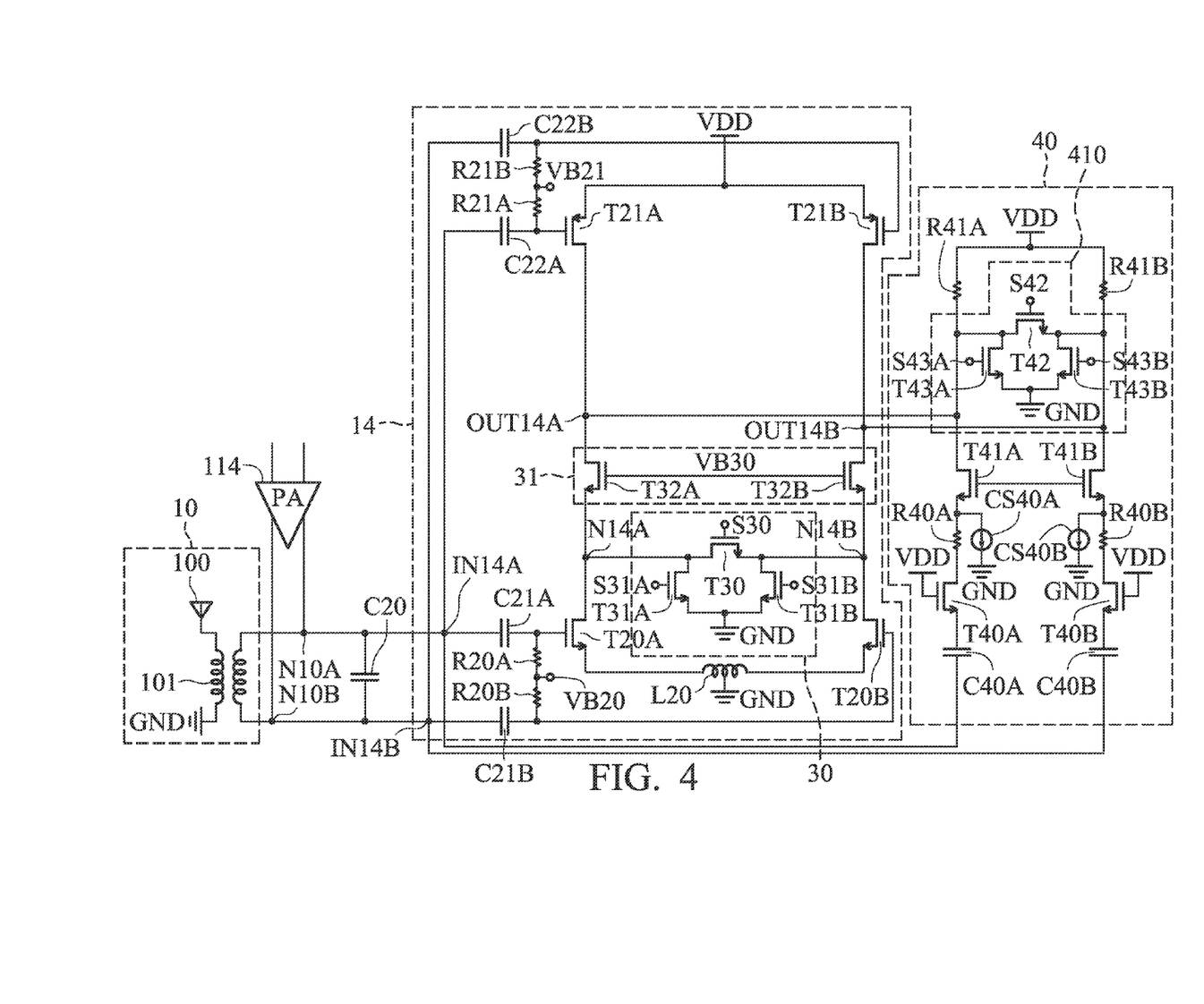
FIG. 4 shows another exemplary embodiment of an amplifier in the transceiver device of FIG. 1.

FIG. 4 shows another exemplary embodiment of the amplifier 14. In FIGS. 3 and 4, the same elements are labeled with the same reference markings, thus related descriptions are omitted here. In the embodiment of FIG. 4, the amplifier 14 further comprises a load 40. The load 40 is coupled between the differential input terminals IN14A and IN14B and the differential output terminals OUT14A and OUT14B. As shown in FIG. 4, the load 40 comprises capacitors C40A and C40B, resistors R40A, R40B, R41A, and R41B, transistors T40A, T40B, T41A, and T41B, current sources CS40A and CS40B, and a canceling circuit 410. Referring to FIG. 4, the canceling circuit 410 comprises transistors T42, T43A, and T43B. In the embodiment, the transistors T40A, T40B, T41A, T41B, T42A, and T42B are implemented by N-type transistors. As shown in FIG. 4, source of the transistor T42 is coupled to the differential output terminals OUT14B, a drain thereof is coupled to the differential output terminals OUT14A, and a gate thereof receives a control signal S42. A source of the transistor T43A is coupled to the ground voltage GND, a drain thereof is coupled to the differential output terminals OUT14A, and a gate thereof receives a control signal S43A. A source of the transistor T43B is coupled to the ground voltage GND, a drain thereof is coupled to the differential output terminals OUT14B, and a gate thereof receives a control signal S43B. When the transceiver device 1 operates in the test mode, the transistor T42 is turned on by the control signal S42 to balance the voltages, respectively, at the differential output terminals OUT14A and OUT14B. Moreover, the transistors T43A and T43B are turned on, respectively, by the control signals S43A and S43B to pull the voltages at the differential output terminals OUT14A and OUT14B to a voltage level with respect to the reference voltage source, for example, approximately to the voltage level of the ground voltage GND. The canceling circuit 410 is helpful to reduction of leakage signals passing through the differential output terminals OUT14A and OUT14B. Therefore, through the operations of the canceling circuit 30 and 410, leakage current from the differential input terminals IN14A and IN14B to the differential output terminals OUT14A and OUT14B of the amplifier 14 is further decreased more effectively, thereby enhancing the accuracy in the determination of the performance of the transmitter 11 and the receiver mixing unit 12. The above elements of the load 40 can form an amplifying circuit with a common gate structure. In another embodiment, the canceling circuit 30 as an example in this embodiment may be replaced by the canceling circuit 20 of FIG. 2.

Figure 5:
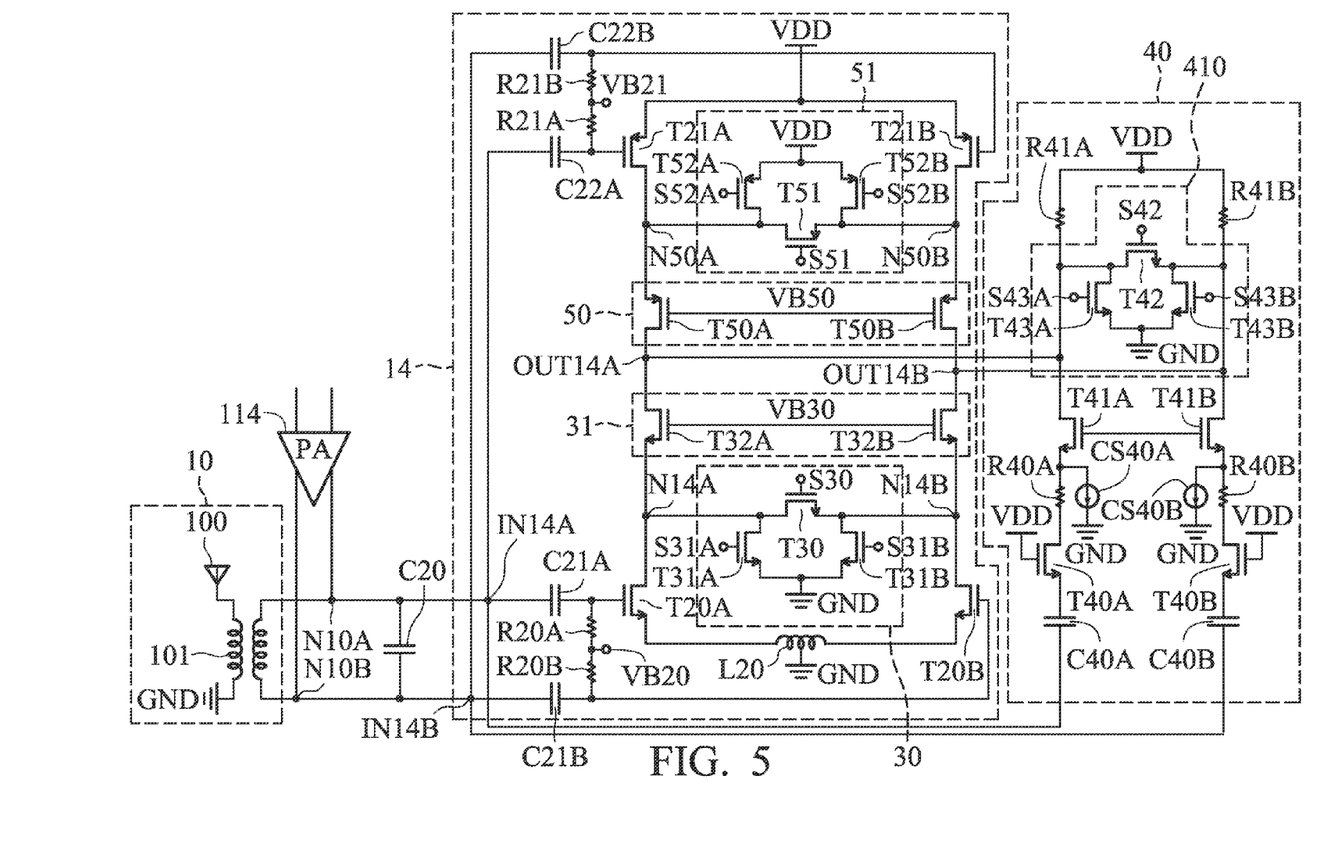
FIG. 5 shows another exemplary embodiment of an amplifier with a differential complementary structure in the transceiver device of FIG. 1.

In some embodiments, the amplifier 14 may have a differential complementary structure, as shown in FIG. 5. In FIGS. 4 and 5, the same elements are labeled with the same reference markings, thus related descriptions are omitted here. In the embodiment of FIG. 5, the amplifier 14 further comprises a load 50 and a canceling circuit 51. The load 50 is coupled to a pair of differential nodes N50A and N50B and the differential output terminals OUT14A and OUT14B. In FIG. 5, the load 50 comprises a pair of load transistors T50A and T50B. In the embodiment, the load transistors T50A and T50B are implemented by P-type transistors. Sources of the load transistors T50A and T50B are coupled to the differential nodes N50A and N50B, respectively. Drains of the load transistors T50A and T50B are coupled to the differential output terminals OUT14A and OUT14B. Gates of the load transistors T50A and T50B are coupled together, and a bias VB50 may be provided to the gates of the load transistors T50A and T50B.

As shown in FIG. 5, the canceling circuit 51 comprises transistors T51, T52A, and T52B. In the embodiment, the transistors T51, T52A, and T52B are implemented by P-type transistors. A source of the transistor T51 is coupled to the differential node N50B, a drain thereof is coupled to the differential node N50A, and a gate thereof receives a control signal S51. A source of the transistor T52A is coupled to the supplying voltage VDD, a drain thereof is coupled to the differential node N50A, and a gate thereof receives a control signal S52A. A source of the transistor T52B is coupled to the supplying voltage VDD, a drain thereof is coupled to the differential node N50B, and a gate thereof receives a control signal S52B. When the transceiver device 1 operates in the test mode, the transistor T51 is turned on by the control signal S51 to balance the voltages, respectively, at the differential nodes N50A and N50B. Moreover, the transistors T52A and T52B are turned on, respectively, by the control signals S52A and S52B to pull the voltages at the differential nodes N50A and N50B to a voltage level respect to the supplying voltage VDD, for example, approximately to the voltage level of the supplying voltage VDD. In the amplifier 14 of FIG. 5, the operations of the elements, excluding the load 50 and the canceling circuit 51, are the same as the description related to FIG. 4 to determine the turned-on/turned-off status of the amplifier 14. Accordingly, similar to the embodiment of FIG. 4, the turned-on/turned-off status of the amplifier 14 in the embodiment of FIG. 5 is determined by at least one of the bias voltages VB20, VB21, VB30, and VB50, and thus the related description of their operation is omitted. In another embodiment, the canceling circuit 51 of this embodiment may be replaced by a canceling circuit with single one transistor, similar to the canceling circuit 20 of FIG. 2 but with one P-type transistor.

According to the above balance operation of the canceling circuit 20 or 30 and the balance operation of the canceling circuit 51, the voltages, respectively, at the differential nodes N14A and N14B and the voltages, respectively, at the differential nodes N50A and N50B are substantially balanced, thereby decreasing leakage current from the differential input terminals IN14A and IN14B to the differential output terminals OUT14A and OUT14B of the amplifier 14. Thus, in the test mode, the performance of the transmitter 11 and the receiver mixing unit 12 may be determined accurately.

Figure 6:
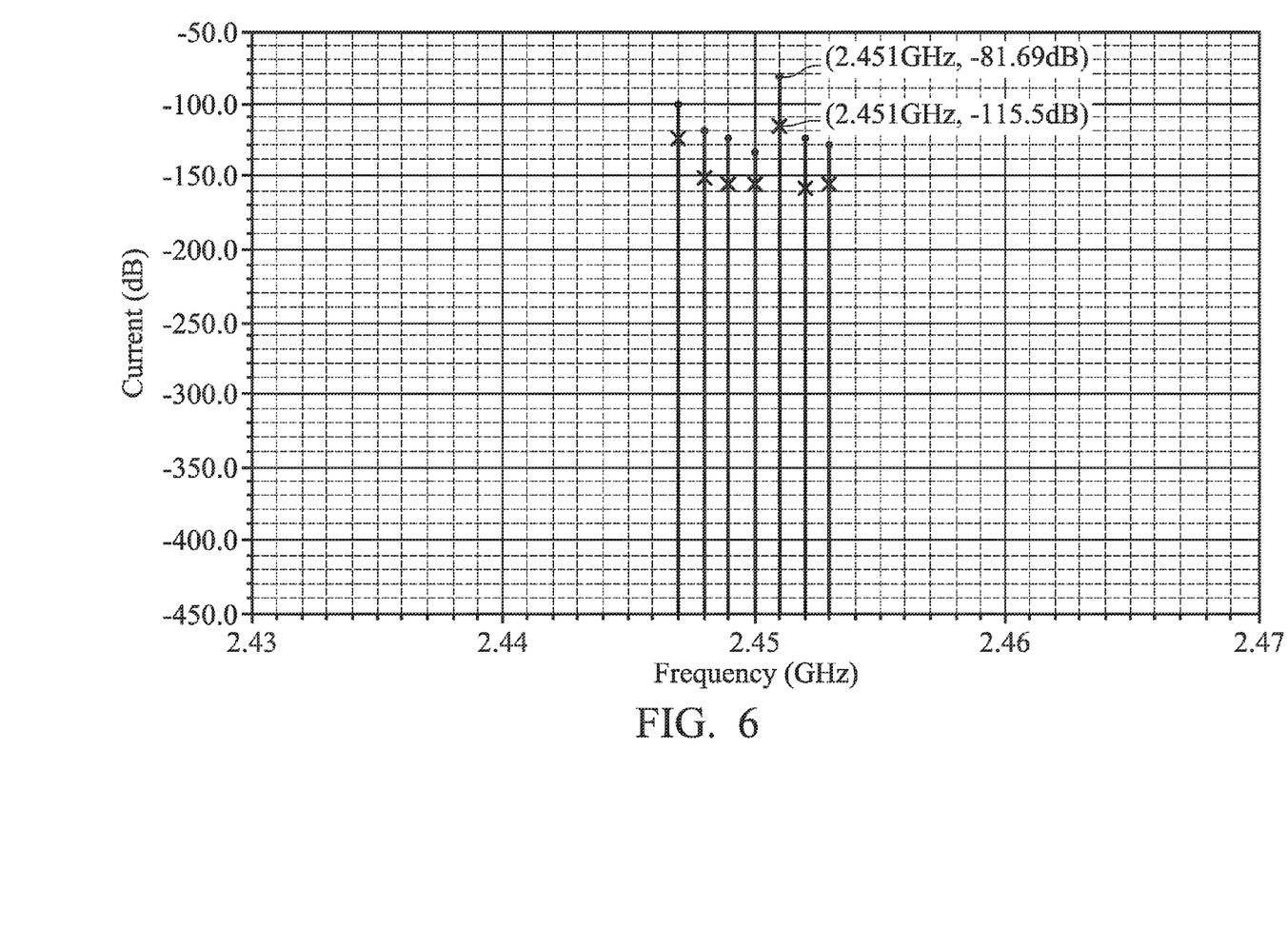
FIG. 6 shows leakage currents induced by the amplifier with the canceling circuit of FIG. 5 and an amplifier without any canceling circuit at various frequencies in a test mode.

In FIG. 6, crisscross points represent the leakage currents induced by the amplifier 14 with the canceling circuit 20 at various frequencies in the test mode, and black points represent the leakage currents induced by an amplifier without any canceling circuit at various frequencies in the test mode. Referring to FIG. 6, when the canceling circuit 20 of the amplifier 14 performs the balance operation, the leakage currents are decreased. For example, about the frequency of 2.45 GHz, the leakage current is decreased by 34 dB.

Figure 7:
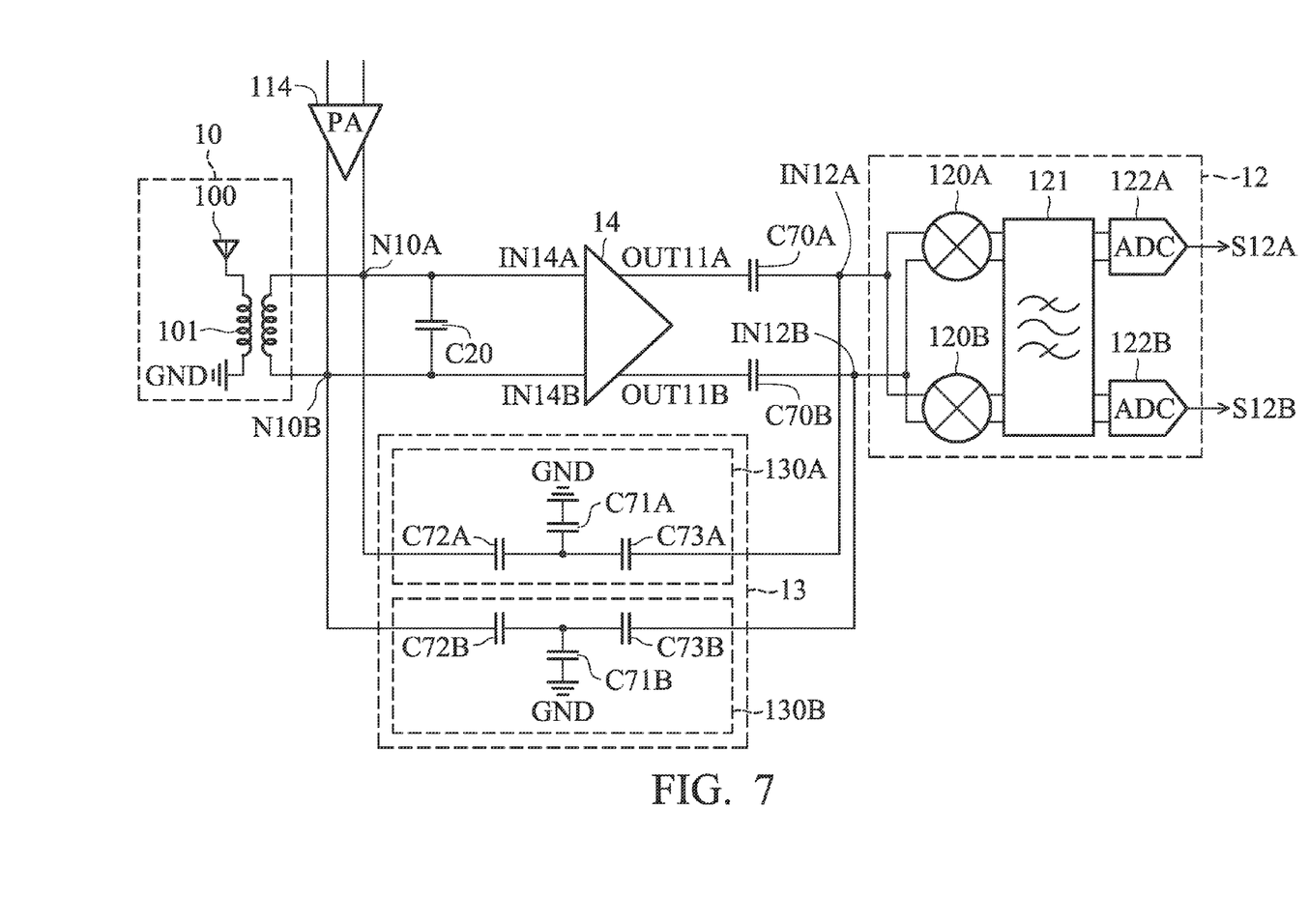
FIG. 7 shows an exemplary embodiment of a loopback path circuit in the transceiver device of FIG. 1.

FIG. 7 shows an exemplary embodiment of the loopback path circuit 13. For clarity, FIG. 7 shows the antenna unit 10, the amplifier 14, the PA 114 of the transmitter 11, and the receiver mixing unit 12. Referring to FIG. 7, the transceiver device 1 further comprises capacitors C70A and C70B. The capacitor C70A is coupled between the differential output terminal OUT14A of the amplifier 14 and the input differential input terminal IN12A of the receiver mixing unit 12, while the capacitor C70B is coupled between the differential output terminal OUT14B of the amplifier 14 and the input differential input terminal IN12B of the receiver mixing unit 12. The loopback path circuit 13 comprises two loopback path units 130A and 130B. The loopback path unit 130A comprises capacitors C71A, C72A, and C73A. The capacitors C72A and C73A are coupled in series between the common node N10A and the differential input terminal IN12A of the receiver mixing unit 12. The capacitor C71A is coupled between the joint point between the capacitors C72A and C73A and the ground voltage GND. The loopback path unit 130B comprises capacitors C71B, C72B, and C73B. The capacitors C72B and C73B are coupled in series between the common node N10B and the differential input terminal IN12B of the receiver mixing unit 12. The capacitor C71B is coupled between the joint point between the capacitors C72B and C73B and the ground voltage GND. Referring to FIG. 7, the loopback path circuit 13 provides high impedance at the common nodes N10A and N10B and the differential input terminals IN12A and IN12B. Thus, when the transceiver device 1 operates in the test mode, less current is consumed. Moreover, due to the capacitor arrangement in the loopback path circuit 13, the amplifier 14 acts as a shunt-shunt feedback with voltage coupling when the loopback path circuit 13 works.

Figure 8:
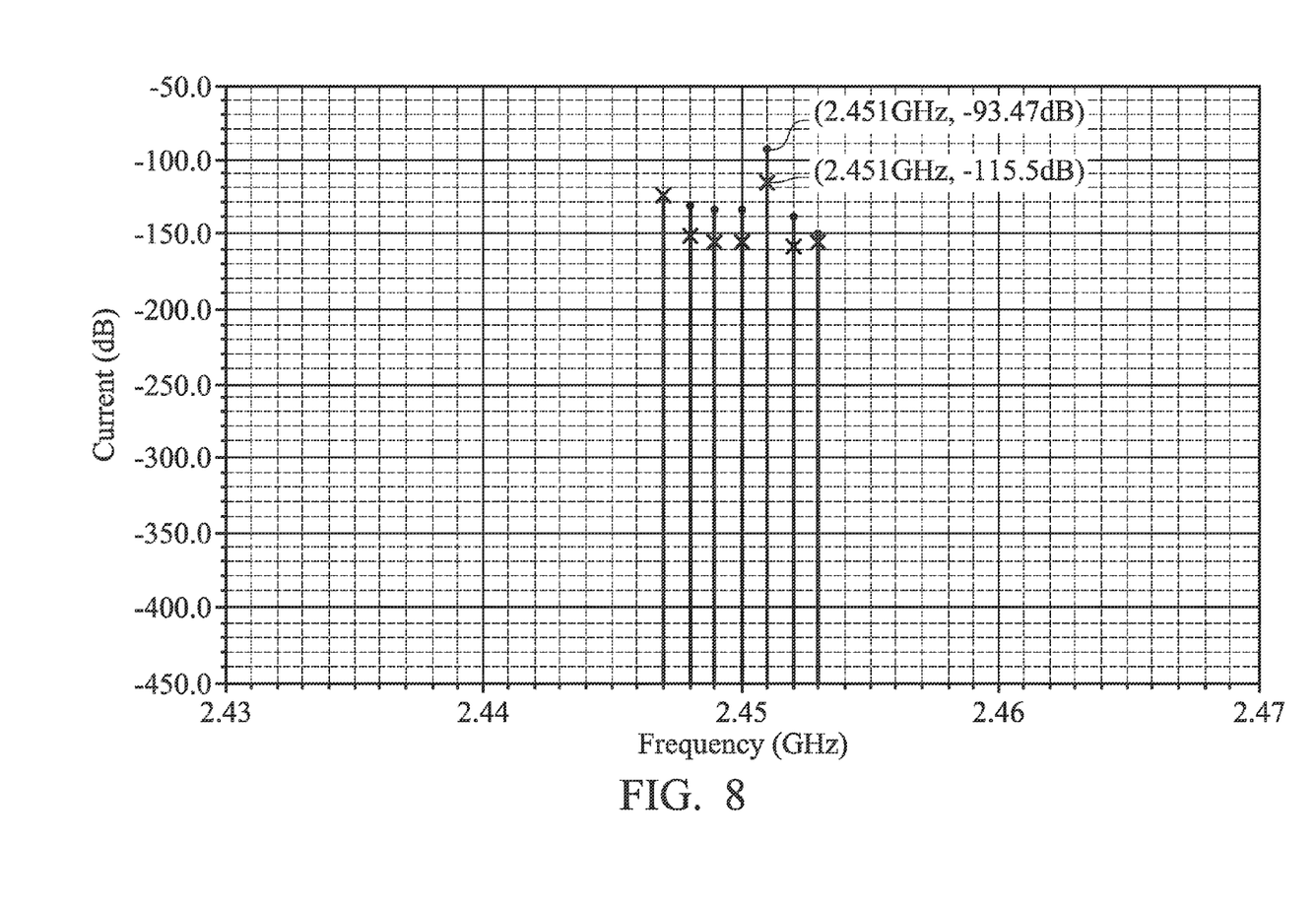
FIG. 8 shows leakage currents induced in the amplifier with the canceling circuit of FIG. 5 and leakage currents passing through the loopback path circuit of FIG. 7 at various frequencies in a test mode.

In FIG. 8, crisscross points represent the leakage currents induced by the amplifier 14 with the canceling circuit 20 in the test mode, and black points represent the leakage currents passing through the loopback path circuit 13 at various frequencies in the test mode. Referring to FIG. 8, in the test mode, the leakage current induced by the amplifier 14 is less than the leakage current passing through the loopback path circuit 13. For example, at the frequency of 2.45 GHz, the leakage current induced by the amplifier 14 is less than the leakage current passing through the loopback path circuit 13 by 22 dB. Thus, the leakage current induced by the amplifier 14 may not disadvantageously affect the operation of the loopback path circuit 13.

Figure 9:
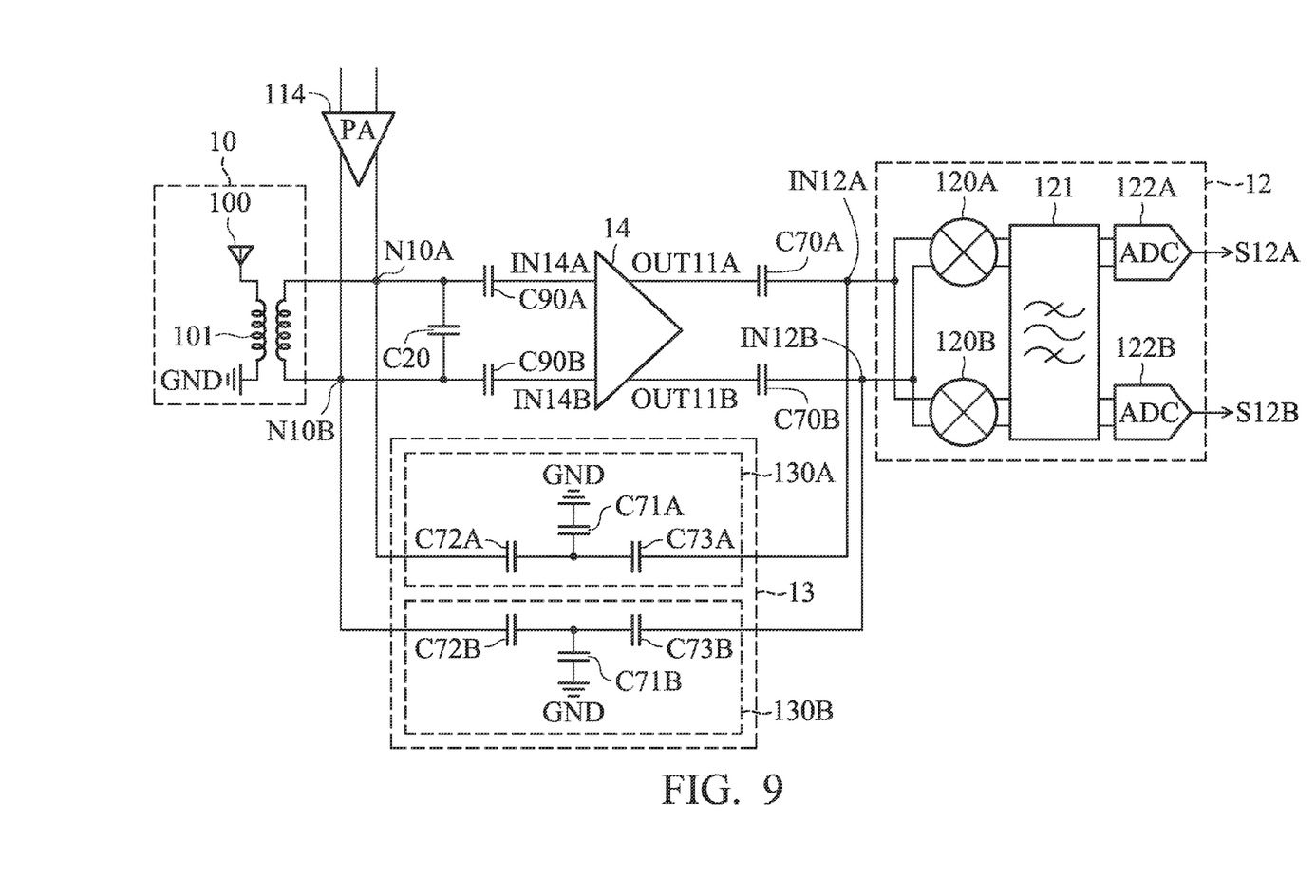
FIG. 9 shows another exemplary embodiment of a loopback path circuit in the transceiver device of FIG. 1.

FIG. 9 shows another exemplary embodiment of the loopback path circuit 13. In FIGS. 7 and 9, the same elements are labeled with the same reference markings, thus related descriptions are omitted here. In the embodiment of FIG. 9, the amplifier 14 further comprises capacitors C90A and C90B. The capacitor C90A is coupled between the common node N10A and the differential input terminal IN14A of the amplifier 14, while the capacitor C90B is coupled between the common node N10B and the differential input terminal IN14B of the amplifier 14. The capacitors C90A and C90B are used for ac-coupling and dc-blocking to the signals from the PA 114 to the amplifier 14.

Figure 10:
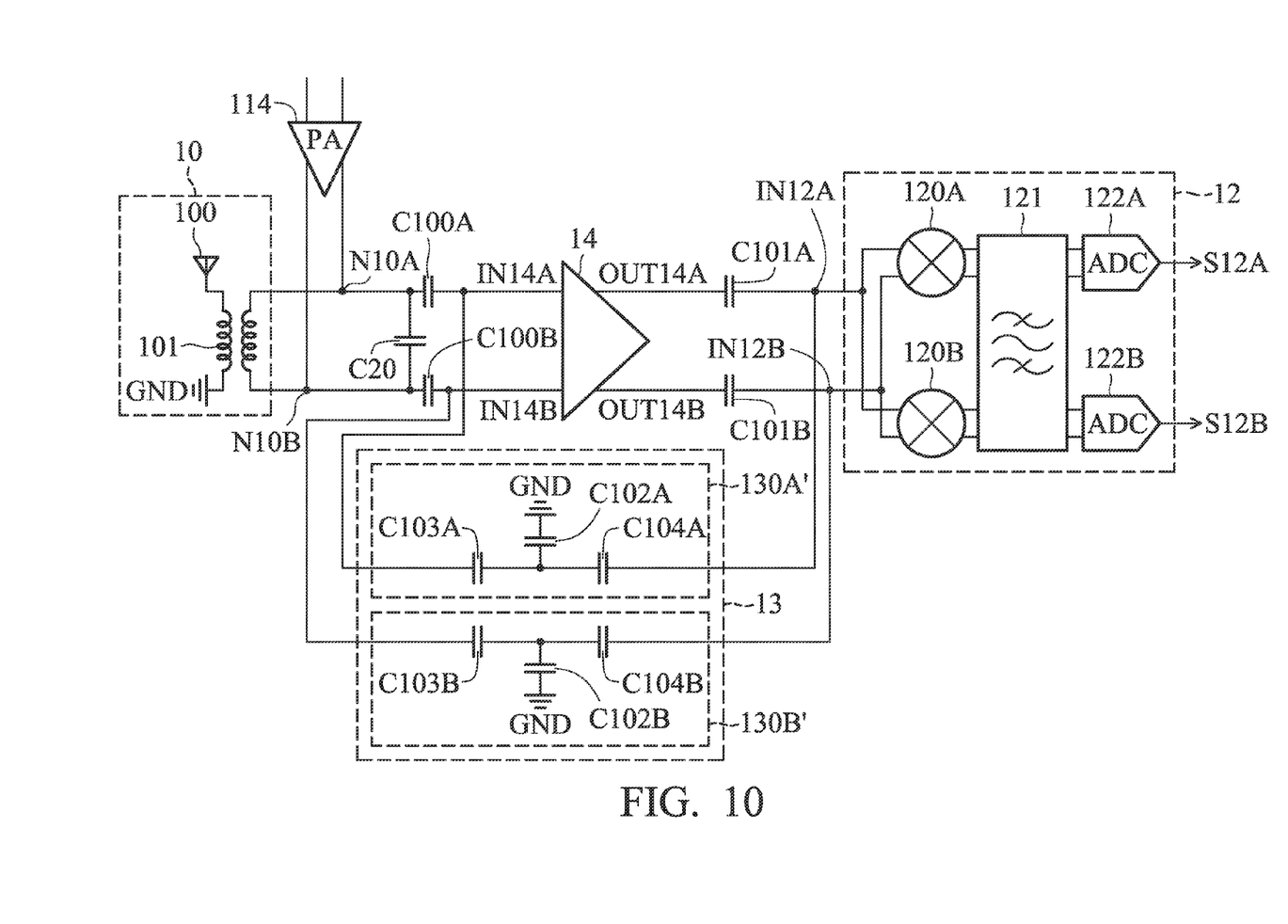
FIG. 10 shows further another exemplary embodiment of a loopback path circuit in the transceiver device of FIG. 1.

FIG. 10 shows further another exemplary embodiment of the loopback path circuit 13. For clarity, FIG. 10 shows the antenna unit 10, the amplifier 14, the PA 114 of the transmitter 11, and the receiver mixing unit 12. Referring to FIG. 10, the transceiver device 1 further comprises capacitors C100A, C100B, C101A, and C101B. The capacitor C100A is coupled between the common node N10A and the differential input terminal IN14A of the amplifier 14, while the capacitor C100B is coupled between the common node N10B and the differential input terminal IN14B of the amplifier 14. Accordingly, the differential input terminals IN14A and IN14B of the amplifier 14 are coupled to the common node N10A and N10B through the capacitors C100A and C100B, respectively. Due to the arrangement of the capacitors C100A and C100B, the capacitors C100A and C100B are used for ac-coupling and dc-blocking to the signals from the PA 114 to the amplifier 14. The capacitor C101A is coupled between the differential output terminal OUT14A of the amplifier 14 and the input differential input terminal IN12A of the receiver mixing unit 12, while the capacitor C101B is coupled between the differential output terminal OUT14B of the amplifier 14 and the input differential input terminal IN12B of the receiver mixing unit 12. The loopback path circuit 13 comprises two loopback path units 130A' and 130B'. The loopback path unit 130A' comprises capacitors C102A, C103A, and C104A. The capacitors C103A and C104A are coupled in series between the differential input terminal IN14A of the amplifier 14 and the differential input terminal IN12A of the receiver mixing unit 12. The capacitor C102A is coupled between the joint point between the capacitors C103A and C104A and the ground voltage GND. The loopback path unit 130B' comprises capacitors C102B, C103B, and C104B. The capacitors C103B and C104B are coupled in series between the differential input terminal IN14B of the amplifier 14 and the differential input terminal IN12B of the receiver mixing unit 12. The capacitor C102B is coupled between the joint point between the capacitors C103B and C104B and the ground voltage GND. Referring to FIG. 10, the loopback path circuit 13 provides high impedance at the differential input terminals IN14A and IN14B of the amplifier 14 and the differential input terminals IN12A and IN12B. Thus, when the transceiver device 1 operates in the test mode, less current is consumed. Moreover, due the capacitor arrangement in the loopback path circuit 13, the amplifier 14 acts as a shunt-shunt feedback with voltage coupling when the loopback path circuit 13 works.

Figure 11:
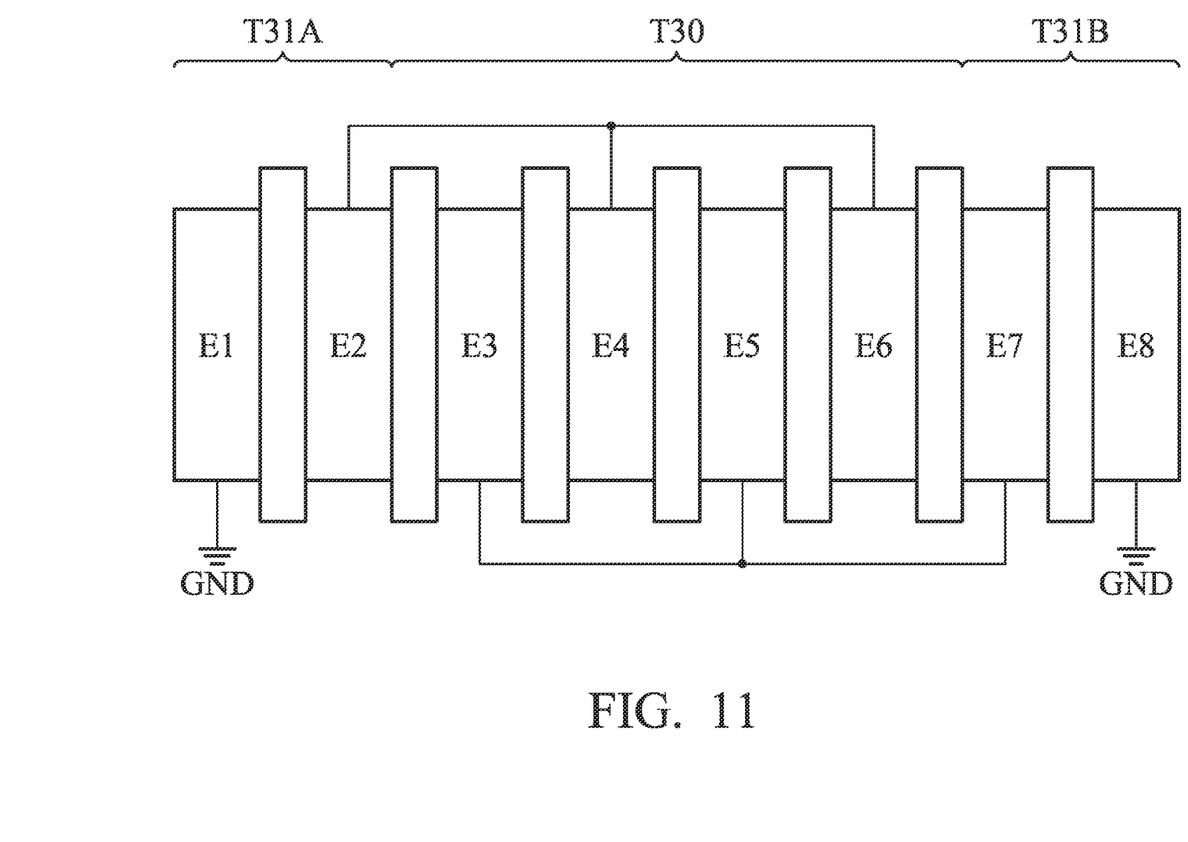
FIG. 11 shows formation of transistors in the canceling circuit of FIG. 3.

In the above embodiment of FIG. 3, the canceling circuit 30 has three transistors T30, T31A and T31B. In some embodiments, the formation of the transistors T30, T31A and T31B of the canceling circuit 30 is ribbing structures. As shown in FIG. 11, the source and the drain of the transistor T31A, the source and drain of the transistor T30, and the source and the drain of the transistor T31B are formed with ribbing structures. The electrodes E1 and E2 serve as the source and the drain of the transistor T31A, respectively. The electrodes E2, E4, and E6 serve as the drain of the transistor T30, while the electrodes E3, E5, and E7 serve as the source of the transistor T30. The electrodes E7 and E8 serve as the drain and the source of the transistor T31B, respectively. The electrodes E1~E7 are arranged with ribbing structures.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier, comprising:
    a pair of first input transistors, coupled between a pair of first differential nodes and a reference voltage source, for receiving a pair of input signals;
    a first load coupled to the pair of first differential nodes and a pair of differential output terminals of the amplifier; and
    a first canceling circuit, coupled between the first differential nodes, for balancing voltages, respectively, at the first differential nodes when the amplifier is turned off,
    wherein the first canceling circuit comprises:
    a first transistor having a first electrode directly connected to one of the first differential nodes, a second electrode directly connected to the other of the first differential nodes, and a control electrode receiving a first control signal,
    wherein when the amplifier is turned off, the first transistor is turned on by the first control signal to balance the voltages, respectively, at the first differential nodes.

2. The amplifier as claimed in claim 1, wherein the first canceling circuit further comprises:
    a second transistor having a first electrode coupled to the reference voltage source, a second electrode coupled to one of the first differential nodes, and a control electrode receiving a second control signal; and
    a third transistor having a first electrode coupled to the reference voltage source, a second electrode coupled to the other of the first differential nodes, and a control electrode receiving a third control signal,
    wherein when the amplifier is turned off, the second and third transistor are turned on, respectively, by the second and third control signals to pull the voltages, respectively, at the first differential nodes to a voltage level with respect to the reference voltage source.

3. The amplifier as claimed in claim 2, wherein the first and second electrodes of the second transistor, the first and second electrodes of the first transistor, and the first and second electrodes of the third transistor are formed with ribbing structures.

4. The amplifier as claimed in claim 1, wherein the first load comprises:
    a first load transistor having a first electrode coupled to one of the first differential nodes, a second electrode coupled to one of the differential output terminals, and a control electrode; and
    a second load transistor having a first electrode coupled to the other of the first differential nodes, a second electrode coupled to the other of the differential output terminals, and a control electrode,
    wherein the amplifier is turned on when the first and second load transistors are turned on.

5. The amplifier as claimed in claim 1, wherein the first load comprises an amplifying circuit with a common gate structure.

6. The amplifier as claimed in claim 1, further comprising:
    a pair of second input transistors coupled between a pair of second differential nodes and a supplying voltage source, for receiving the pair of input signals;
    a second load coupled to the pair of second differential nodes and the pair of differential output terminals;
    a second canceling circuit, coupled between the second differential nodes, for balancing voltages, respectively, at the second differential nodes when the amplifier is turned off.

7. The amplifier as claimed in claim 1, wherein turned-on/turned-off status of the amplifier is determined by a bias voltage applied to the first load.

8. A transceiver device operating in a test mode and a normal mode, comprising:
    an antenna unit for receiving a radio frequency input signal to generate a pair of input signals and receiving a pair of output signals to generate an RF output signal;
    a transmitter having a pair of first differential output terminals coupled to the antenna unit, respectively, at a first common node and a second common node, and providing the pair of output signals;
    an amplifier having a pair of first differential input terminals coupled to the antenna unit, respectively, at the first and second common nodes, for receiving the pair of input signals and performing an amplifying operation on the pair of input signals;
    a receiver mixing unit, having a pair of second differential input terminals coupled to the amplifier, for receiving the pair of amplified input signals from the amplifier; and
    a loopback path circuit coupled between the first and second common nodes and the pair of second differential input terminals of the receiver mixing unit,
    wherein the amplifier comprises:
    a pair of first input transistors coupled between a pair of first differential nodes and a reference voltage source, for receiving the pair of input signals;

a first load coupled to the pair of first differential nodes and a pair of second differential output terminals of the amplifier; and a first canceling circuit, coupled between the first differential nodes, for balancing voltages, respectively, at the first differential nodes when the transceiver device operates in the test mode, wherein the first canceling circuit comprises:

a first transistor having a first electrode directly connected to one of the first differential nodes, a second electrode directly connected to the other of the first differential nodes, and a control electrode receiving a first control signal, wherein when the transceiver device operates in the test mode, the first transistor is turned on by the first control signal to balance the voltages, respectively, at the first differential nodes.

9. The transceiver device as claimed in claim 8, wherein the first canceling circuit comprises:

a second transistor having a first electrode coupled to the reference voltage source, a second electrode coupled to one of the first differential nodes, and a control electrode receiving a second control signal; and a third transistor having a first electrode coupled to the reference voltage source, a second electrode coupled to the other of the first differential nodes, and a control electrode receiving a third control signal, wherein when the transceiver device operates in the test mode, the second and third transistor are turned on, respectively, by the second and third control signals to pull the voltages, respectively, at the first differential nodes to a voltage level with respect to the reference voltage source.

10. The transceiver device as claimed in claim 9, wherein the first and second electrodes of the second transistor, the second and first electrodes of the first transistor, and the second and first electrodes of the third transistor are formed with ribbing structures.

11. The transceiver device as claimed in claim 8, wherein the first load comprises:

a first load transistor having a first electrode coupled to one of the first differential nodes, a second electrode coupled to one of the differential output terminals, and a control electrode;

a second load transistor having a first electrode coupled to the other of the first differential nodes, a second electrode coupled to the other of the differential output terminals, and a control electrode, wherein the transceiver device operates in the normal mode when the first and second load transistors are turned on, and the transceiver device operates in the test mode when the first and second load transistors are turned off.

12. The transceiver device as claimed in claim 8, wherein the first load comprises an amplifying circuit with a common gate structure.

13. The transceiver device as claimed in claim 8, further comprising:

a second pair of input transistors coupled between a pair of second differential nodes and a supplying voltage source, for receiving the pair of input signals;

a second load coupled to the pair of second differential nodes and the pair of differential output terminals;

a second canceling circuit, coupled between the second differential nodes, for balancing voltages, respectively, at the second differential nodes when the transceiver device operates in the test mode.

14. The transceiver device as claimed in claim 8, wherein whether the transceiver device operates in the normal mode or in the test mode is determined by a bias voltage applied to the first load.

15. The transceiver device as claimed in claim 8, wherein the loopback path circuit comprises:

a first loopback path unit comprising a first capacitor and a second capacitor, which are coupled in series between the first common node and one of the second differential input terminals of the receiver mixing unit, and a third capacitor coupled between a joint point between the first and second capacitors and a reference ground;

a second loopback path unit comprising a fourth capacitor and a fifth capacitor, which are coupled in series between the second common node and the other of the second differential input terminals of the receiver mixing unit, and a sixth capacitor coupled between a joint point between the fourth and fifth capacitors and the reference ground.

16. The transceiver device as claimed in claim 15, further comprising:

a seventh capacitor coupled between the first common node and one of the first differential input terminals of the amplifier; and an eighth capacitor coupled between the second common node and the other of the first differential input terminals of the amplifier.

17. The transceiver device as claimed in claim 8, wherein the amplifier acts as a shunt-shunt feedback with voltage coupling when the loopback path circuit works.

18. The transceiver device as claimed in claim 8, wherein the loopback path circuit provides high impedance at the first and second common nodes and the pair of second differential input terminals of the receiver mixing unit.

19. The transceiver device as claimed in claim 8, further comprising:

a first capacitor having a first terminal coupled to the first common node and a second terminal coupled to one of the first differential input terminals of the amplifier; and a second capacitor having a first terminal coupled to the second common node and a second terminal coupled to the other of the first differential input terminals of the amplifier, wherein the loopback path circuit comprises:

a first loopback path unit comprising a third capacitor and a fourth capacitor, which are coupled in series between the first differential input terminal and one of the second differential input terminals of the receiver mixing unit, and a fifth capacitor coupled between a joint point between the third and fourth capacitors and a reference ground;

a second loopback path unit comprising a sixth capacitor and a seventh capacitor, which are coupled in series between the second differential input terminal and the other of the second differential input terminals of the receiver mixing unit, and an eighth capacitor coupled between a joint point between the sixth and seventh capacitors and the reference ground.

* * * * *